United States Patent
Pelli et al.

(10) Patent No.: US 7,561,485 B2
(45) Date of Patent: Jul. 14, 2009

(54) SENSE ARCHITECTURE

(75) Inventors: Gabriele Pelli, Mortara (IT); Lorenzo Bedarida, Vimercate (IT); Simone Bartoli, Cambiago (IT); Giorgio Bosisio, Robbiate (IT)

(73) Assignee: Atmel Corporation, San Jose, CA (US)

( * ) Notice: Subject to any disclaimer, the term of this patent is extended or adjusted under 35 U.S.C. 154(b) by 186 days.

(21) Appl. No.: 11/652,771

(22) Filed: Jan. 12, 2007

(65) Prior Publication Data

US 2008/0170441 A1    Jul. 17, 2008

(51) Int. Cl.
*G11C 7/02* (2006.01)
(52) U.S. Cl. .............................. 365/210.1; 365/210.14; 365/210.15
(58) Field of Classification Search .............. 365/210.1, 365/210.14, 210.15
See application file for complete search history.

(56) References Cited

U.S. PATENT DOCUMENTS

| | | | |
|---|---|---|---|
| 5,113,372 A * | 5/1992 | Johnson | ...................... 365/205 |
| 6,052,323 A | 4/2000 | Kawamura | |
| 6,525,969 B1 | 2/2003 | Kurihara et al. | |
| 6,608,787 B1 | 8/2003 | Daga et al. | |
| 6,697,293 B2 | 2/2004 | Brennan et al. | |
| 6,751,141 B1 | 6/2004 | Alvandpour et al. | |
| 6,954,102 B2 | 10/2005 | Bedarida et al. | |
| 7,142,454 B2 * | 11/2006 | Yang et al. | ............. 365/185.18 |
| 2003/0035334 A1 | 2/2003 | Terzioglu et al. | |
| 2003/0173998 A1 | 9/2003 | Terzioglu et al. | |
| 2004/0100844 A1 | 5/2004 | Alvandpour et al. | |
| 2004/0169529 A1 | 9/2004 | Afghahi et al. | |
| 2007/0230245 A1 * | 10/2007 | Watanabe et al. | ...... 365/185.09 |

* cited by examiner

*Primary Examiner*—Son Dinh
*Assistant Examiner*—Nam Nguyen
(74) *Attorney, Agent, or Firm*—Schwegman, Lundberg & Woessner P.A.

(57) ABSTRACT

A memory system is disclosed. In one embodiment, the memory system includes a first bitline, where the first bitline produces a first transient current. The memory system also includes a sense amplifier coupled to the first bitline. The memory system also includes a second bitline coupled to the sense amplifier, where the second bitline produces a second transient current that is equal to the first transient current. The sense amplifier enables the first and second transient currents to be canceled. According to the system disclosed herein, the state of a memory cell may be determined without being adversely affected by transient currents.

22 Claims, 5 Drawing Sheets

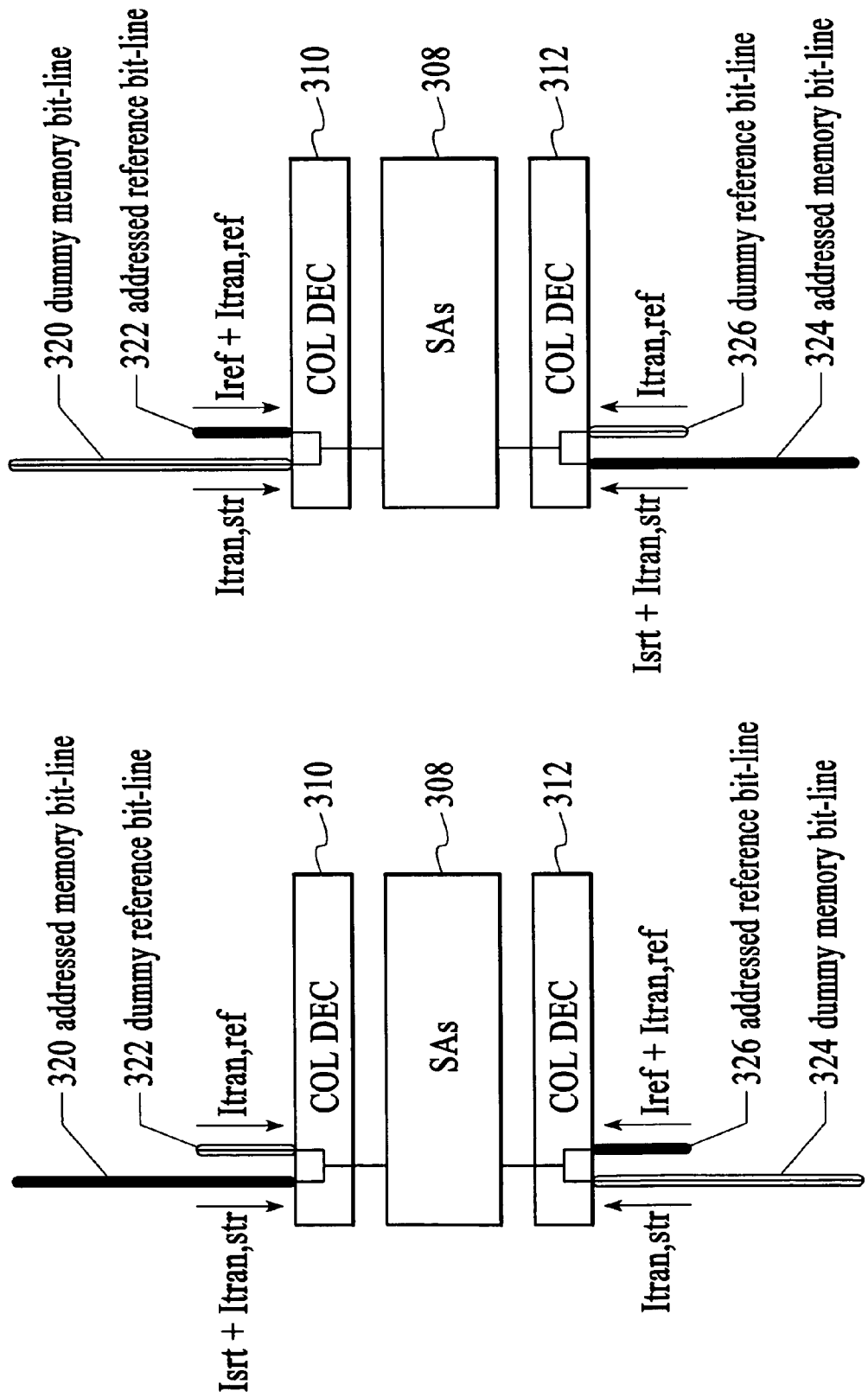

SENSE ARCHITECTURE

FIELD OF THE INVENTION

The present invention relates to computer systems, and more particularly to memory systems.

BACKGROUND OF THE INVENTION

Memory systems such flash memory systems utilize sense amplifiers in read operations to read data from memory cells, where the state of a given memory cell is determined by how much current it sinks under well defined biasing conditions. In the simplest case, the storing element may be in two states: a "0" state, or a "1" state. In a "0" state, a storage element does not sink current, and in a "1" state, a storage element sinks current. The storing element may be, for example, a single flash memory cell (as in a NOR flash memory) or a string (as in a NAND flash memory). A string is typically a storage element that has a series of single flash memory cells (e.g., 8, 16, or more flash memory cells).

A problem with some flash memory systems is that they could not allow fast random access time due to low current levels at the sense amplifiers. This is particularly the case with flash memory utilizing NAND architecture. Another issue arises due to the transient currents associated with the memory matrix bitlines, which connect the storing elements to the sense amplifiers. The NAND architecture is again particularly critical to this issue because it is usually built up with a very big memory matrix and thus has very long bitlines. Transient currents are problematic, because they are added to memory cell currents and reference currents, which are used to determine memory cell states. Erroneous memory cell and reference current readings may consequently result in erroneous read operations.

Accordingly, what is needed is an improved memory system. The present invention addresses such a need.

SUMMARY OF THE INVENTION

A memory system is disclosed. In one embodiment, the memory system includes a first bitline, where the first bitline produces a first transient current. The memory system also includes a sense amplifier coupled to the first bitline. The memory system also includes a second bitline coupled to the sense amplifier, where the second bitline produces a second transient current that is equal to the first transient current. The sense amplifier enables the first and second transient currents to be canceled.

According to the system disclosed herein, the state of a memory cell may be determined without being adversely affected by transient currents.

BRIEF DESCRIPTION OF THE DRAWINGS

FIG. 4A illustrates the operation of the memory system of FIG. 3 in accordance with one embodiment.

FIG. 4B illustrates the operation of the memory system of FIG. 3 in accordance with another embodiment.

DETAILED DESCRIPTION OF THE INVENTION

The present invention relates to computer systems, and more particularly to memory systems. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiments shown, but is to be accorded the widest scope consistent with the principles and features described herein.

A memory system is disclosed. In one embodiment, the memory system utilizes a dummy memory bitline to generate a transient current that cancels any transient current associated with an addressed memory bitline. Similarly, the memory system utilizes a dummy reference bitline to generate a transient current that cancels any transient current associated with an addressed reference bitline. The dummy memory bitline, addressed memory bitline, dummy reference bitline, and the addressed reference bitline are coupled to the same sense amplifier to enable the transient currents to be canceled. As a result, the state of a given memory cell associated with the addressed memory bitline can be determined based on the difference between the memory bitline current and the reference bitline current without being adversely affected by transient currents. To more particularly describe the features of the present invention, refer now to the following description in conjunction with the accompanying figures.

Although the present invention disclosed herein is described in the context of NAND flash memory, the present invention may apply to other types of memories such as NOR memories and memory architectures, and still remain within the spirit and scope of the present invention.

Figure 1:
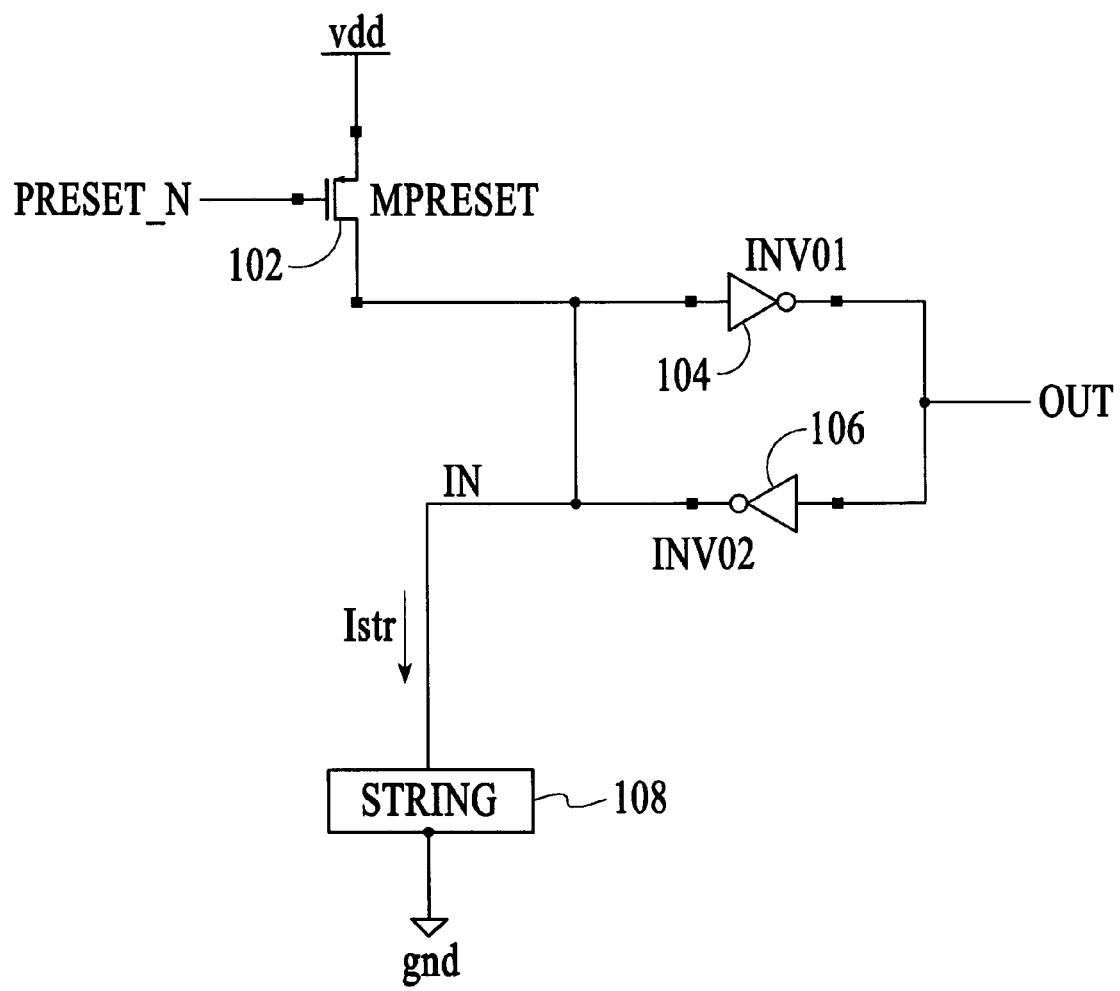
FIG. 1 is a schematic diagram of a flash memory circuit in accordance with one embodiment.

FIG. 1 is a schematic diagram of a flash memory circuit 100 in accordance with one embodiment. The flash memory circuit includes a transistor 102, inverters 104 and 106, and a NAND string 108, which is a series of flash memory cells. As FIG. 1 shows, in a NAND flash memory, the read operation is usually performed by linking the string 108 to the input node of a bi-stable latch circuit (i.e., inverters 104 and 106).

Before a read operation begins, a control signal PRESET_N presets the output level OUT of the flash memory circuit 100 to one of the two stable states (e.g., "0" or "1"). Once the read operation begins, if the string current is zero, the latch output OUT remains at the preset value. If the string current is positive, the string current discharges the voltage at the latch input IN at least to the trigger level of the inverter 104, so that the latch output can switch to the opposite state. The string current may be very low due to the series of flash memory cells that it includes. Accordingly, the latch input node cannot be discharged very fast. Because of this, NAND architecture typically does not allow fast random access time. In contrast, a single sense amplifier has only a simple latch circuit. Accordingly, it is possible to design very high density sense amplifiers to perform reading operations simultaneously on a very high number of strings, obtaining a very high data throughput after an initial latency time.

One method for providing faster read operations is to use a more complex and thus usually bigger sense amplifier. For example, in a current-comparison sense amplifier, the read operation is performed by comparing the current at a given storage element (or memory cell current $I_{cell}$) with a reference current ($I_{ref}$), which has a value that is usually placed between the memory cell current value in the logical state "1" and that in the logical state "0". A sense amplifier typically reads the difference between the two currents and then converts the difference into a voltage signal.

Figure 2:
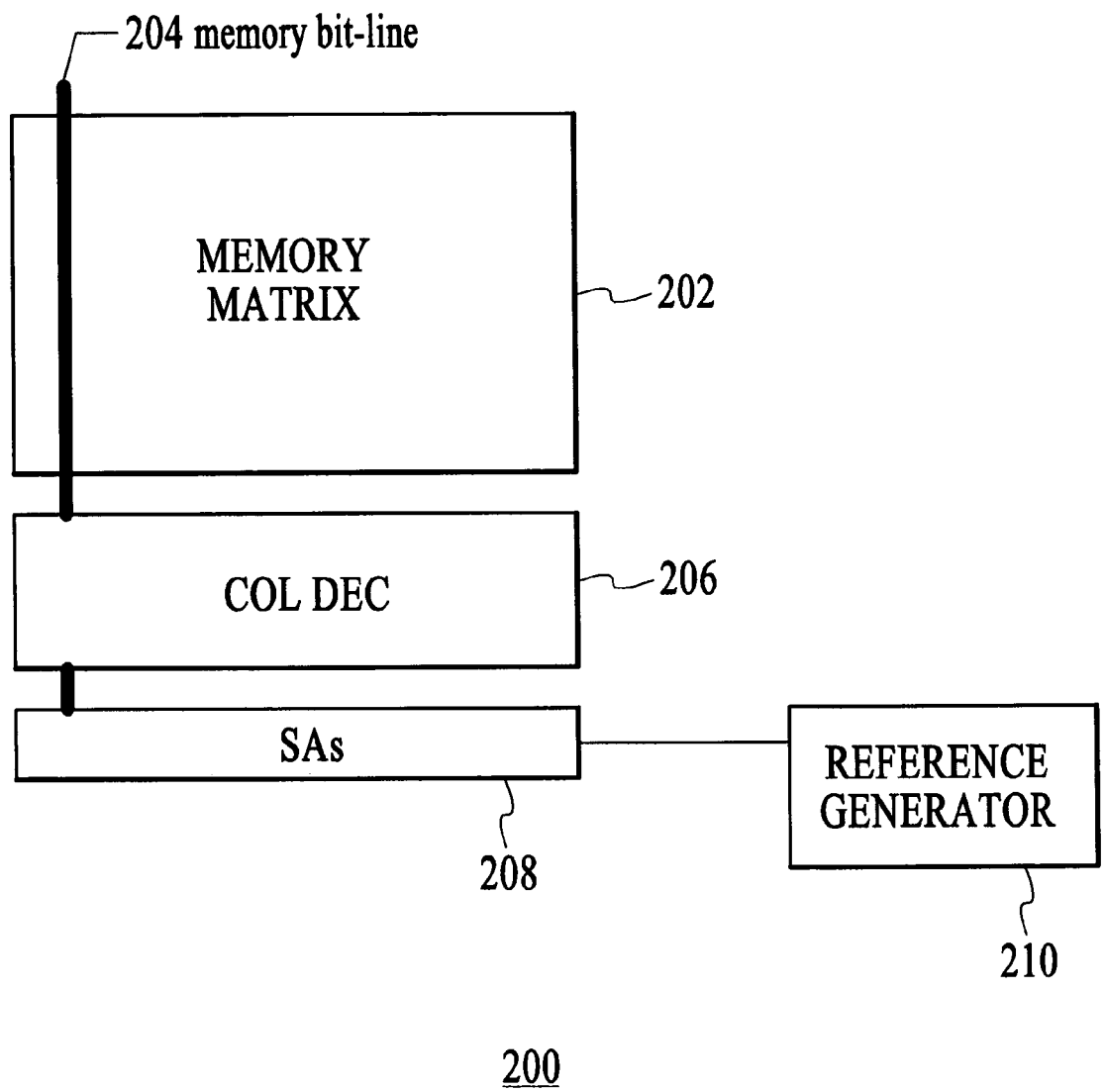
FIG. 2 is a block diagram showing a memory system in accordance with one embodiment.

FIG. 2 is a block diagram showing memory system 200 in accordance with one embodiment. The memory system 200 includes a matrix 202 with memory bitlines 204, a column decoder 206, sense amplifiers 208, and a reference generator 210. The reference generator 210 generates a reference current. Alternatively, the reference current maybe generated by another flash memory cell in order to track the process characteristics of the memory cells. The reference generator 210 may be located in various positions relative to the sense amplifiers 208. A memory bitline 204 is a physical column that connects together the drain of the cells belonging to it. For ease of illustration, only one memory bitline 204 is shown. Each bitline 204 couples to a column decoder 206, which couples the addressed bitlines (i.e., the addressed memory cells) to the sense amplifiers 208.

Once the read operation begins, the voltage levels at the nodes of the read path adjust to the appropriate biasing conditions in order to allow a given memory cell to conduct its proper current. For example, the sense amplifier may bias the addressed cell to raise its drain to the desired voltage value. In one embodiment, the corresponding bitline that couples the drain of the memory cell to the sense amplifier may be considered an RC network, which should be raised to the same voltage level. The required current may be supplied by the sense amplifier, and current passes through the same path from where the memory cell current came.

During an initial transient period, the sense amplifier reads the current at the memory cell ($I_{cell}$) together with a transient current referred to as a memory bitline precharge current. During this transient period, the memory bitline precharge current typically reaches a peak (usually greater than the memory cell current) and then drops to zero once the memory cell is properly biased. The precharge current is only one example of a possible transient current which may affect both the memory path and the reference path. Another transient behavior may be related, for example, to the time to polarize the gate of the addressed cell and so on. Accordingly, a transient current may include any possible transient current $I_{tran,cell}$ coming from the memory cell and/or transient current $I_{tran,ref}$ coming from the reference bitlines.

During the transient period, the sense amplifier may read not only the difference (e.g., $I_{cell}-I_{ref}$) but the sum (e.g., $I_{cell}+I_{tran,cell}-I_{ref}-I_{tran,ref}$) of all current contributions. The two transient components may be bigger than both the memory cell current and the reference current. Moreover, since the reference current path could be very different with respect to the memory current path, the two components $I_{tran,cell}$ and $I_{tran,ref}$ could be very different with respect to one another. This could significantly worsen the performance of a read operation, because the only way to correctly read the data is to wait until both of the transient currents are negligible relative to the difference ($I_{cell}-I_{ref}$). Unfortunately, waiting may take too much time, thereby compromising performance, especially in the case where cell current is very small and a long bitline connects the memory cell to the column decoder.

Another important issue regards the static value (i.e., the final value) of the reference current. The reference current should be supplied to the sense amplifiers from the reference block, wherever it is placed. This means that some circuits such as mirror connected transistors need to transfer the reference current to the sense amplifier battery. Unfortunately, this operation could be affected by errors resulting from a mismatch and channel length modulation error in the mirror circuitry transistors. This issue is particularly important where the memory cell current and the reference current are very small. In fact, the current error could not be negligible relative to the absolute reference current value, thereby heavily affecting the final value of the reference current supplied to a sense amplifier. Consequently, the static current difference ($I_{cell}-I_{ref}$) from which a proper data read depends could be very different, resulting in an erroneous read.

Finally, this architecture has some issues involving both the static (the final reference current value) and the dynamic (the reference and memory transient currents) behaviors. Regarding the dynamic behavior, the only way to avoid problems with transient currents is to wait that until they become negligible with respect to the current difference ($I_{cell}-I_{ref}$). Unfortunately, this could take too much time with respect to the current target read performance. Regarding the static error, it may change the current difference value ($I_{cell}-I_{ref}$) from which the data acquisition depends.

In one embodiment, the memory system 200 of FIG. 2 may be used to obtain a fast random access time for a NAND memory. However, such architecture should be adapted to a NAND memory situation, where the memory string current is involved in the sense amplifier operations. First, to perform a current comparison, a reference current for the NAND case is needed. In one embodiment, the reference generator 210 may be used to generate the reference current. However, with this approach, the reference current has some characteristics which are completely independent with respect to the memory strings current.

The memory system 200 may have suboptimal static and dynamic behavior, and may perform poorly when the storage element current is low and its associated memory bitline is long. NAND memory is typically designed with very large array dimensions and thus with very long memory bitlines.

A preferred approach is to generate a reference current more suitable for the purpose of the embodiments. First, it is important to have a reference current that can track the process characteristics of the memory strings. Accordingly, as described in more detail below in connection with FIG. 3, a reference string may be used to generate a reference current. In one embodiment, the special reference string is operable to sink a current having a value between that of memory string current while the memory string is at a "1" state and a "0" state. For example, if the memory string is at a "0" state, and thus does not sink a current, the reference string may sink one half of the memory string current value at the "1" state. Accordingly, in one embodiment, the reference string may have double the number of memory cells relative to the number of memory cells in the memory string. Alternately, the reference string may have the same number of memory cells as the memory string, with some over-programmed cells.

In one embodiment, the reference string may generate the reference current, where the parameters of one or more memory cells are set such that they enable the reference string to conduct the desired current. In one embodiment, the reference string may be built with any combination of multiple special strings. As such, in one embodiment, all of the resulting reference strings may be contained in a special "reference matrix" block, separate from the memory string matrix.

Figure 3:
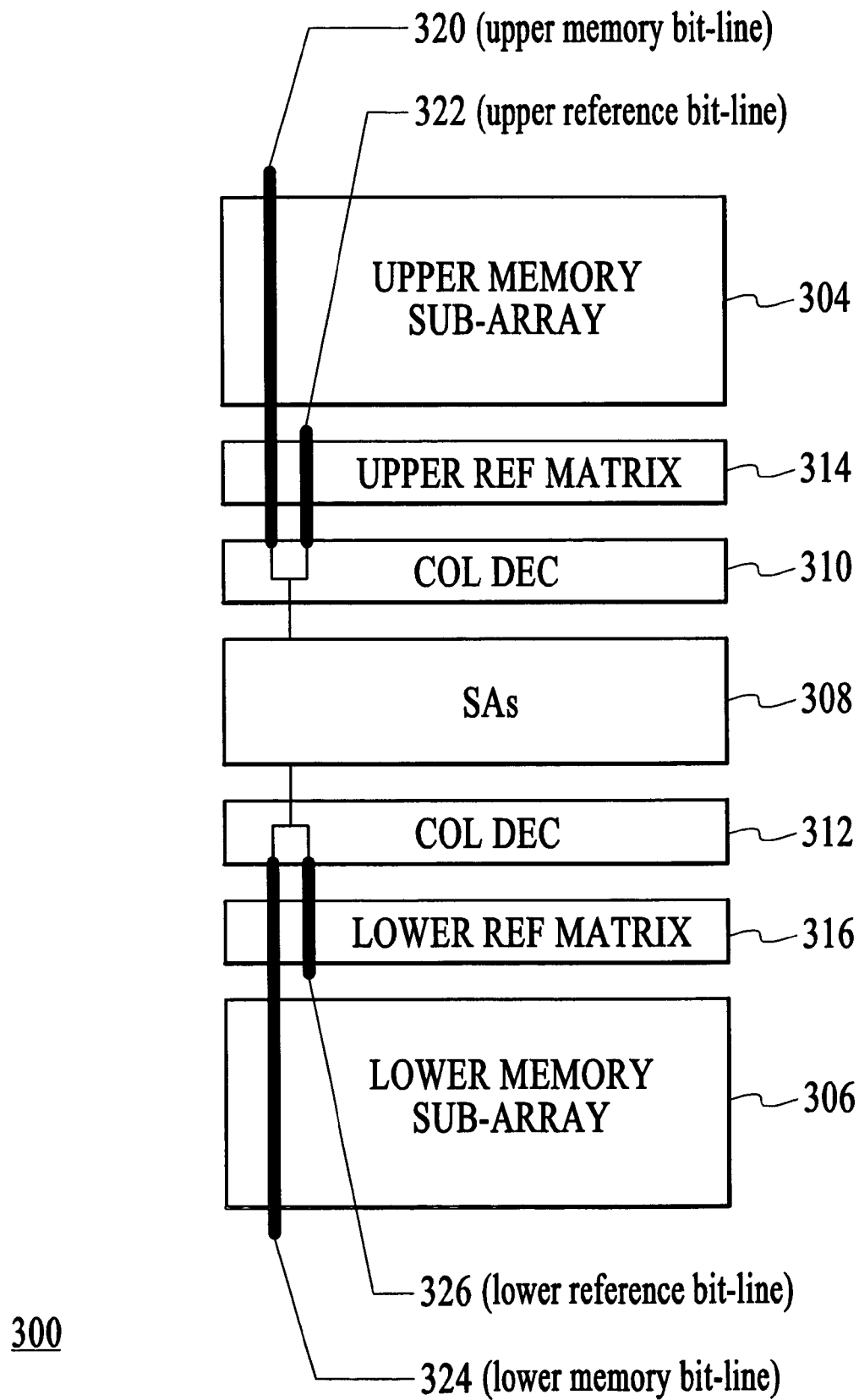
FIG. 3 is a block diagram of a memory system in accordance with another embodiment.

FIG. 3 is a block diagram of a memory system 300 in accordance with another embodiment. The memory system 300 includes a memory matrix having two identical memory sub-arrays 304 and 306 linked to sense amplifiers 308 by two column decoders 310 and 312, respectively. The memory system 300 also includes reference matrixes 314 and 316 coupled between the memory matrixes 304 and 306, respectively. In one embodiment, the reference matrixes 314 and 316 each have their own column decoders. The reference matrixes 314 and 316 may be referred to as "local reference" architecture, since they are located close to the sense amplifiers 308. Also, the memory system 300 may be operatively coupled to a processor and/or memory controller.

In one embodiment, the memory sub-array 304 includes a memory bitline 320, and reference matrix 314 includes a reference bitline 322. Similarly, the memory sub-array 306 includes a memory bitline 324, and reference matrix 316 includes a reference bitline 326.

In one embodiment, a single reference string (e.g., series of memory cells) may be associated with each sense amplifier (or more generally may be associated with each memory bitline). In one embodiment, the reference matrixes 314 and 316 may provide the reference current to each sense amplifier. In one embodiment, the reference matrixes 314 and 316 may provide the reference current directly without using any transferring circuitry such as mirror-connected transistors. As a result, the reference matrixes 314 and 316 avoid errors due to the transistor mismatches or channel length modulation errors. The reference matrixes 314 and 316 also properly supply the reference currents to each sense amplifier without any static errors. In other words, the static current difference ($I_{str}-I_{ref}$), on which a proper read operation depends, is not modified by some error (i.e., due to transistor mismatches or channel length modulation errors) that may affect the reference current value.

In one embodiment, the memory system 300 has a symmetrical structure, where the memory bitline 320 may be identical to the memory bitline 324, and where the reference bitline 322 may be identical to the reference bitline 326. In one embodiment, the number, type, and dimension of the transistors of the column decoders 310 and 312 connecting any given bitline to the sense amplifier may be identical to those connecting the corresponding symmetrical bitline. For example, if three transistors connect the memory bitline 320 to a given sense amplifier, three transistors of the same type and dimension may also connect the memory bitline 324 (which is symmetrical to the memory bitline 320) to the same sense amplifier.

In one embodiment, each memory path (i.e., bitline) connecting a given memory string or reference string to a sense amplifier corresponds to an identical memory path connecting respective, symmetrical memory string or reference string to the same sense amplifier.

In one embodiment, the memory system 300 is unaffected by memory transient currents and reference transient currents during read operations. For ease of illustration, the sub-array 304 and reference matrix 314 as associated bitlines are referred to as elements on the "upper side". Similarly, the sub-array 306 and reference matrix 316 as associated bitlines are referred to as elements on the "lower side." Each sense amplifier 308 is operable to determine a current difference ($I_{up}-I_{down}$), where $I_{up}$ is the total current coming from the upper side and $I_{down}$ is the total current coming from the lower side.

FIG. 4A illustrates the operation of the memory system 300 of FIG. 3 in accordance with one embodiment, and FIG. 4B illustrates the operation of the memory system 300 of FIG. 3 in accordance with another embodiment.

Referring to FIG. 4A, in one scenario, if an upper memory string is addressed (e.g., memory bitline 320), the reference current may be supplied by the lower local reference string (e.g., addressed reference bitline 326) linked to the same sense amplifier 308. In one embodiment, the reference current may come from the reference bitline 322.

In one embodiment, the memory bitline 324 (symmetrical to addressed memory bitline 320) may be referred to as a dummy memory bitline, and the reference bitline 322 (symmetrical to the addressed reference bitline 326) may be referred to as a dummy reference bitline. The memory bitline 324 and the reference bitline 322 may be activated connecting them to the same sense amplifier 308. The sense amplifier 308 may couple the dummy memory bitline 324 and the dummy reference bitline 322 and precharge them to the appropriate biasing voltage for read operations. Accordingly, each bitline corresponds to a precharge current (such as transient currents $I_{tran,cell}$ and $I_{tran,ref}$). In one embodiment, the bitlines 320, 322, 324, and 326 have associated transient currents $I_{320}$, $I_{322}$, $I_{324}$, and $I_{326}$. In one embodiment, the differences among the transient currents appears at input of the sense amplifier 108 as follows:

$$(I_{up}-I_{down})=(I_{str}+I_{320}+I_{322})-(I_{ref}+I_{324}+I_{326})$$

In one embodiment, the sense amplifier 308 may be designed such that once the read operation begins, each coupling of an addressed memory bitline and a dummy memory bitline reaches the same biasing conditions by the same control signals.

In one embodiment, the transient current of a given bitline may be equal to that of its corresponding symmetrical (or dummy) bitline as follows:

$$I_{320}=I_{324}=I_{tran,str} \text{ and } I_{322}=I_{326}=I_{tran,ref}$$

This results in the following:

$$(I_{up}-I_{down})=(I_{str}+I_{tran,str}+I_{tran,ref})-(I_{ref}+I_{tran,str}+I_{tran,ref}).$$

This results in the following:

$$(I_{up}-I_{down})=I_{str}-I_{ref}.$$

Accordingly, the memory bitline 324 generates a transient current that cancels the transient current associated with the memory bitline 320. Similarly, the reference bitline 322 generates a transient current that cancels the transient current associated with the reference bitline 326. As a result, the sense amplifier architecture is not affected by the memory transient current and the reference transient current components. In fact, the transient currents do not appear when determining the memory cell state, which, in one embodiment, depends only on the difference between the string current and the reference current (e.g., $I_{str}-I_{ref}$). Moreover, it is suitable to read the correct data even during the transient period of the circuit, because the current difference ($I_{up}-I_{down}$) is correct from the beginning. This dramatically speeds up the access time of the memory, because it would not be necessary to wait for the transient period to end to read data.

Referring to FIG. 4B, in another scenario, the opposite case, the addressed memory bitline is memory bitline 324, and the addressed reference bitline is addressed reference bitline 322. The memory bitline 320 and the reference bitline 326 are the symmetrical bitlines and thus function as dummy bitlines, thereby supplying only their transient currents to the sense amplifier 308. This results in the following:

$$(I_{up}-I_{down})=(I_{ref}+I_{320}+I_{322})-(I_{str}+I_{324}+I_{326}).$$

Accordingly, the transient current of a bitline is equal to the symmetrical bitline, as follows:

$$I_{320}=I_{324}=I_{tran,str} \text{ and } I_{322}=I_{326}=I_{tran,ref}$$

This results in the following:

$$(I_{up} - I_{down}) = (I_{ref} + I_{tran,str} + I_{tran,ref}) - (I_{str} + I_{tran,str} + I_{tran,ref}).$$

This results in the following:

$$(I_{up} - I_{down}) = I_{ref} - I_{str}.$$

Accordingly, the memory bitline 320 generates a transient current that cancels the transient current associated with the memory bitline 324. Similarly, the reference bitline 326 generates a transient current that cancels the transient current associated with the reference bitline 322. The final result of this scenario is the same in magnitude as the previous scenario but with an opposite sign. Also, the result is not affected by any transient current components.

As shown above in both scenarios, the bitlines used as dummy bitlines are actual memory and reference bitlines of the memory array and reference array/matrix. Accordingly, no extra bitlines are needed to exploit their transient currents, and no extra memory chip area is required for implementation.

Figures 5A, 5B:
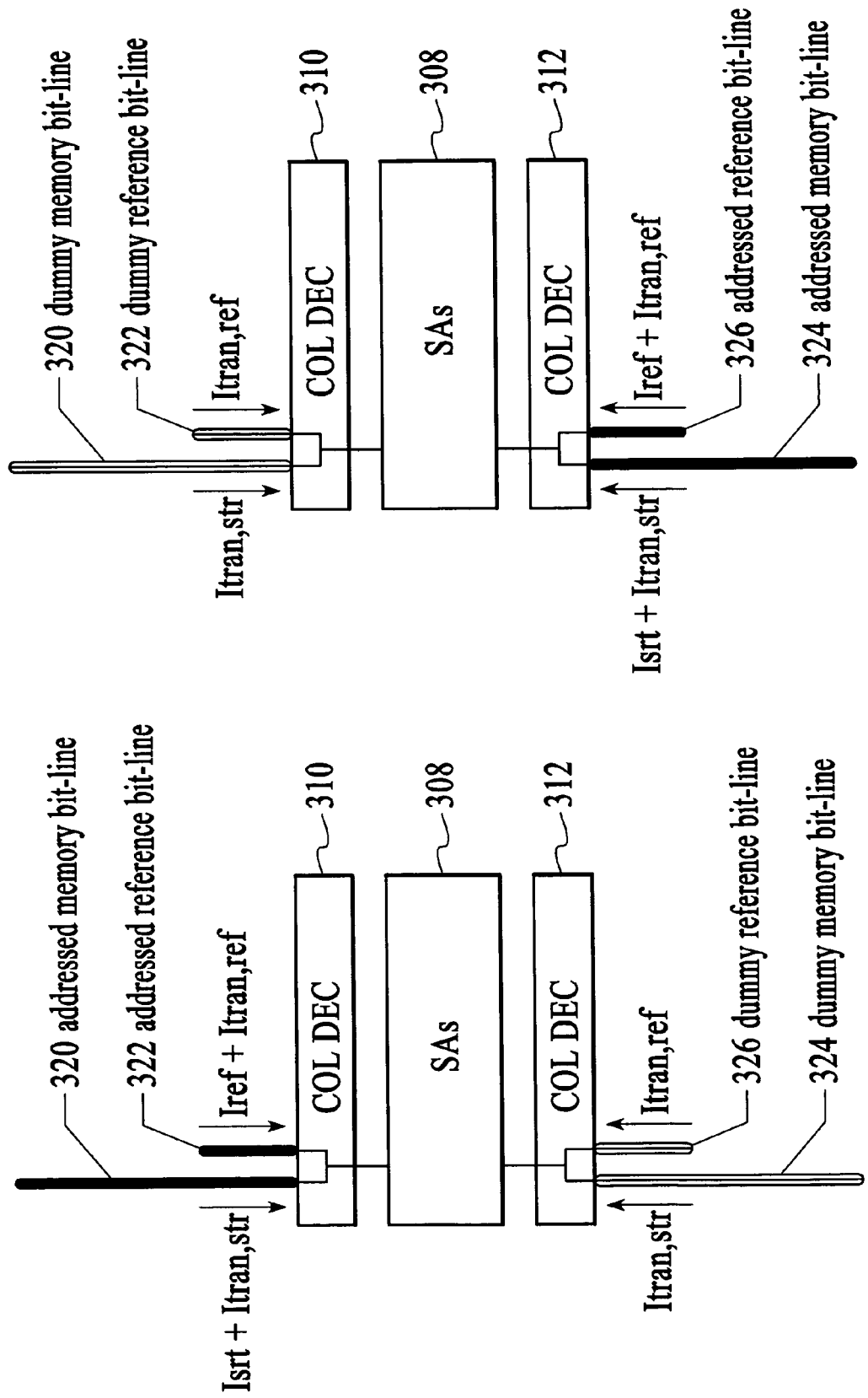
FIG. 5A illustrates the operation of the memory system of FIG. 3 in accordance with one embodiment.
FIG. 5B illustrates the operation of the memory system of FIG. 3 in accordance with another embodiment.

The following two scenarios in connection with FIGS. 5A and 5B illustrate how the column decoder may enable the memory current and the reference string currents to be supplied separately to each sense amplifier.

FIG. 5A illustrates the operation of the memory system 300 of FIG. 3 in accordance with one embodiment, and FIG. 5B illustrates the operation of the memory system 300 of FIG. 3 in accordance with another embodiment.

Referring to FIG. 5A, a scenario is shown where both the string and the reference currents come from the upper side and are supplied by the addressed memory bitline 320 and the addressed referenced bitline 322. In this case, the memory bitline 324 and the reference bitline 326 function as dummy bitlines to generate transient currents to cancel any transient currents associated with addressed memory bitline 320 and the addressed reference bitline 322. The currents may be expressed as follows:

$$(I_{up} - I_{down}) = (I_{str} + I_{tran,str} + I_{ref} + I_{tran,ref}) - (I_{tran,str} + I_{tran,ref}).$$

This results in the following:

$$(I_{up} - I_{down}) = I_{str} - I_{ref}.$$

Accordingly, the memory bitline 324 generates a transient current that cancels the transient current associated with the memory bitline 320. Similarly, the reference bitline 326 generates a transient current that cancels the transient current associated with the reference bitline 322.

Referring to FIG. 5B, a scenario is shown where both the string current and the reference current come from the lower side and are supplied by the addressed memory bitline 324 and addressed reference bitline 326, respectively. In one embodiment, the memory bitline 320 and the reference bitline 322 function as dummy bitlines. This results in the following:

$$(I_{up} - I_{down}) = (I_{tran,str} + I_{tran,ref}) - (I_{str} + I_{tran,str} + I_{ref} + I_{tran,ref}).$$

This results in the following:

$$(I_{up} - I_{down}) = I_{ref} - I_{str}.$$

Accordingly, the memory bitline 320 generates a transient current that cancels the transient current associated with the memory bitline 324. Similarly, the reference bitline 322 generates a transient current that cancels the transient current associated with the reference bitline 326. As shown above, embodiments improve the performance of read operations by exploiting the transient current of actual bitlines without having to add any extra bitlines.

According to the system and method disclosed herein, the present invention provides numerous benefits. For example, embodiments dramatically speed up memory access time, as embodiments can perform read operations during a transient period without waiting for the transient period to end. This is an advantage especially in memory systems where the memory matrix is large with long bitlines and the precharge phase could take most of the total read access time. Embodiments are also suitable for any memory architecture such as NAND and NOR flash memory architectures.

A memory system has been disclosed. In one embodiment, the memory system utilizes a dummy memory bitline to generate a transient current that cancels any transient current associated with an addressed memory bitline. Similarly, the memory system utilizes a dummy reference bitline to generate a transient current that cancels any transient current associated with an addressed reference bitline. As a result, the state of a given memory cell may be determined without being adversely affected by transient currents.

The present invention has been described in accordance with the embodiments shown. One of ordinary skill in the art will readily recognize that there could be variations to the embodiments, and that any variations would be within the spirit and scope of the present invention. Accordingly, many modifications may be made by one of ordinary skill in the art without departing from the spirit and scope of the appended claims.

What is claimed is:

1. A memory system comprising:
   a first bitline, wherein the first bitline produces a first transient current;
   a sense amplifier coupled to the first bitline;
   a second bitline coupled to the sense amplifier, wherein the second bitline produces a second transient current that is equal to the first transient current, the sense amplifier enabling the first and second transient currents to be canceled;
   a first memory array, wherein the first bitline is a bitline from the first array;
   a first reference array coupled to the first memory array;
   a second reference array coupled to the first reference array via the sense amplifier; and
   a second memory array coupled to the second reference array, wherein the second bitline is a bitline from the second memory array.

2. The system of claim 1 wherein the first and second bitlines are memory bitlines.

3. The system of claim 1 wherein the first bitline is identical to the second bitline.

4. The system of claim 1 further comprising:
   a third bitline coupled to the sense amplifier, wherein the third bitline produces a third transient current; and
   a fourth bitline coupled to the sense amplifier, wherein the fourth bitline produces a fourth transient current that is equal to the third transient current, the sense amplifier enabling the third and fourth transient currents to be canceled.

5. The system of claim 4 wherein the third and fourth bitlines are reference bitlines.

6. The system of claim 4 wherein the third bitline is identical to the fourth bitline.

7. The system of claim 1 wherein the memory system enables read operations to be performed during a transient period without having to wait for the transient period to end.

8. A system comprising:
a processor; and
a memory system coupled to the processor, the memory system comprising:
a first bitline, wherein the first bitline produces a first transient current;
a sense amplifier coupled to the first bitline; and
a second bitline coupled to the sense amplifier, wherein the second bitline produces a second transient current that is equal to the first transient current, the sense amplifier enabling the first and second transient currents to be canceled
a first memory array, wherein the first bitline is a bitline from the first array;
a first reference array coupled to the first memory array;
a second reference array coupled to the first reference array via the sense amplifier; and
a second memory array coupled to the second reference array, wherein the second bitline is a bitline from the second memory array.

9. The system of claim 8 wherein the first and second bitlines are memory bitlines.

10. The system of claim 8 wherein the first bitline is identical to the second bitline.

11. The system of claim 8 further comprising:
a third bitline coupled to the sense amplifier, wherein the third bitline produces a third transient current; and
a fourth bitline coupled to the sense amplifier, wherein the fourth bitline produces a fourth transient current that is equal the third transient current, the sense amplifier enabling the third and fourth transient currents to be canceled.

12. The system of claim 11 wherein the third and fourth bitlines are reference bitlines.

13. The system of claim 11 wherein the third bitline is identical to the fourth bitline.

14. The system of claim 8 wherein the memory system enables read operations to be performed during a transient period without having to wait for the transient period to end.

15. A method for processing read operations, the method comprising:
generating a first transient current with any possible connection between a first reference element from a first reference array or a first storing element from a first memory array and a sense amplifier;
generating a second transient current with any other possible connection a second reference element from a second reference element array or a second storing element from a second memory array and the sense amplifier such that the second transient current is equal to the first transient current; and
enabling the first and second transient currents to be canceled using a sense amplifier.

16. The method of claim 15 further comprising performing read operations during a transient period without having to wait for the transient period to end.

17. The method of claim 15 further at least one of the first and second transient currents is generated from a string of reference memory cells.

18. The method of claim 17 further wherein the string of reference memory cells have parameters that enable the string of reference memory cells to generate a desired current.

19. The method of claim 17 further wherein the string of reference memory cells is built with any combination of multiple special strings.

20. A memory system comprising:
a first memory array including a first bitline;
a second memory array including a second bitline;
a sense amplifier coupled to the first bitline and the second bitline and configured to enable canceling of transient currents between the first and second bitlines;
a first reference array coupled to the first memory array; and
a second reference array coupled to the first reference array via the sense amplifier.

21. The memory system of claim 20 wherein the first reference array includes a first reference bitline coupled to the first bitline, the second reference array includes a second reference bitline coupled to the second bitline.

22. The memory system of claim 20 wherein the first memory array includes a first string of memory cells, and the second memory array includes a second string of memory cells.

* * * * *

UNITED STATES PATENT AND TRADEMARK OFFICE
CERTIFICATE OF CORRECTION

PATENT NO. : 7,561,485 B2
APPLICATION NO. : 11/652771
DATED : July 14, 2009
INVENTOR(S) : Pelli et al.

It is certified that error appears in the above-identified patent and that said Letters Patent is hereby corrected as shown below:

In column 6, line 20, after "$(I_{up}-I_{down})=(I_{str}+I_{320}+I_{322})-(I_{ref}+I_{324}+I_{326})$" insert -- . --.

In column 10, line 5, in Claim 15, after "reference" delete "element".

Signed and Sealed this

Sixteenth Day of February, 2010

David J. Kappos
*Director of the United States Patent and Trademark Office*